(12) United States Patent
Kato et al.

(10) Patent No.: US 11,387,037 B2
(45) Date of Patent: Jul. 12, 2022

(54) SURFACE MOUNT COIL COMPONENT, METHOD OF MANUFACTURING THE SAME, AND DC-DC CONVERTER USING THE SAME

(71) Applicant: Murata Manufacturing Co., Ltd., Nagaokakyo (JP)

(72) Inventors: Noboru Kato, Nagaokakyo (JP); Satoshi Ishino, Nagaokakyo (JP); Mitsuyoshi Nishide, Nagaokakyo (JP); Shinichiro Banba, Nagaokakyo (JP); Masahiro Ozawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1053 days.

(21) Appl. No.: 16/016,726

(22) Filed: Jun. 25, 2018

(65) Prior Publication Data

US 2018/0308627 A1 Oct. 25, 2018

Related U.S. Application Data

(63) Continuation of application No. PCT/JP2017/000651, filed on Jan. 11, 2017.

(30) Foreign Application Priority Data

Feb. 2, 2016 (JP) .............................. JP2016-017736

(51) Int. Cl.
| | |
|---|---|
| *H01F 27/28* | (2006.01) |
| *H01F 27/29* | (2006.01) |
| *H01F 41/04* | (2006.01) |
| *H01F 17/04* | (2006.01) |
| *H01F 27/24* | (2006.01) |

(Continued)

(52) U.S. Cl.
CPC .......... *H01F 27/292* (2013.01); *H01F 17/04* (2013.01); *H01F 27/24* (2013.01); *H01F 27/28* (2013.01);

(Continued)

(58) Field of Classification Search
USPC ........................................................ 336/199
See application file for complete search history.

(56) References Cited

U.S. PATENT DOCUMENTS

| | | | | |
|---|---|---|---|---|
| 5,572,180 A | * | 11/1996 | Huang | .................. H01F 27/292 |
| | | | | 336/200 |
| 2003/0030994 A1 | * | 2/2003 | Takaya | ................ H01F 17/0006 |
| | | | | 361/728 |

(Continued)

FOREIGN PATENT DOCUMENTS

| | | |
|---|---|---|
| JP | 07-192961 A | 7/1995 |
| JP | 2002-158135 A | 5/2002 |

(Continued)

OTHER PUBLICATIONS

Official Communication issued in International Patent Application No. PCT/JP2017/000651, dated Apr. 18, 2017.

*Primary Examiner* — Shawki S Ismail
*Assistant Examiner* — Kazi S Hossain
(74) *Attorney, Agent, or Firm* — Keating & Bennett, LLP (57) ABSTRACT

A surface mount coil component includes an element body with a first surface, a second surface that opposes the first surface, and a third surface connecting the first surface and the second surface, the element body being defined by a compact including magnetic particles; a first conductor pattern provided at the first surface of the element body; a second conductor pattern provided at the second surface of the element body; input/output terminals provided at the third surface of the element body; and metal pins embedded in the element body, ends of each metal pin being connected to the first and second conductor patterns. The first conductor pattern, the second conductor pattern, and the metal pins define a coil conductor. The input/output terminals are defined by a pair of metal pins exposed at the third surface.

16 Claims, 5 Drawing Sheets

(51) Int. Cl.
  *H01F 41/02* (2006.01)
  *H01F 41/10* (2006.01)
  *H02M 3/155* (2006.01)
  *H02M 3/00* (2006.01)
  *H05K 1/18* (2006.01)

(52) U.S. Cl.
  CPC ..... *H01F 27/2804* (2013.01); *H01F 41/0206* (2013.01); *H01F 41/04* (2013.01); *H01F 41/041* (2013.01); *H01F 41/043* (2013.01); *H01F 41/10* (2013.01); *H01F 2017/048* (2013.01); *H01F 2027/2814* (2013.01); *H02M 3/00* (2013.01); *H02M 3/155* (2013.01); *H05K 1/181* (2013.01); *H05K 2201/1003* (2013.01); *H05K 2201/10015* (2013.01); *H05K 2201/10053* (2013.01)

(56) References Cited

U.S. PATENT DOCUMENTS

| | | | |
|---|---|---|---|
| 2005/0122199 A1* | 6/2005 | Ahn | H01F 27/2804 |
| | | | 336/200 |
| 2006/0285367 A1* | 12/2006 | Yasumura | H02M 3/335 |
| | | | 363/21.03 |
| 2009/0175014 A1 | 7/2009 | Zeng et al. | |
| 2011/0074537 A1 | 3/2011 | Nakatsuji | |
| 2013/0229253 A1* | 9/2013 | Inui | H01F 17/0013 |
| | | | 336/200 |
| 2014/0225702 A1 | 8/2014 | Yazaki | |
| 2015/0235753 A1 | 8/2015 | Chatani et al. | |
| 2016/0372259 A1 | 12/2016 | Banba et al. | |
| 2017/0256353 A1* | 9/2017 | Park | C08K 3/28 |
| 2017/0316858 A1* | 11/2017 | Otsubo | H01F 5/04 |
| 2017/0373396 A1 | 12/2017 | Kato et al. | |
| 2018/0096778 A1* | 4/2018 | Yatabe | H01G 4/40 |
| 2019/0259527 A1* | 8/2019 | Yoon | H01F 17/04 |

FOREIGN PATENT DOCUMENTS

| | | |
|---|---|---|
| JP | 5621946 B2 | 11/2014 |
| JP | 2015-088545 A | 5/2015 |
| WO | 2009/150921 A1 | 12/2009 |
| WO | 2014/038706 A1 | 3/2014 |
| WO | 2015/133361 A1 | 9/2015 |
| WO | 2016/143584 A1 | 9/2016 |

\* cited by examiner

SURFACE MOUNT COIL COMPONENT, METHOD OF MANUFACTURING THE SAME, AND DC-DC CONVERTER USING THE SAME

CROSS REFERENCE TO RELATED APPLICATIONS

This application claims the benefit of priority to Japanese Patent Application No. 2016-017736 filed on Feb. 2, 2016 and is a Continuation Application of PCT Application No. PCT/JP2017/000651 filed on Jan. 11, 2017. The entire contents of each application are hereby incorporated herein by reference.

BACKGROUND OF THE INVENTION

1. Field of the Invention

The present invention relates to a surface mount coil component, a method of manufacturing the same, and a DC-DC converter including the same. More particularly, the present invention relates to a surface mount coil component defining a power inductor and a method of manufacturing the same.

2. Description of the Related Art

A multilayer coil component in which a coil pattern formed of a conductive paste is incorporated in a multilayer body including a plurality of ceramic layers that are laminated has been disclosed (see, for example, Japanese Patent No. 5621946). The multilayer coil component is a small, surface-mountable coil component.

Since such a multilayer coil component uses a ferrite material or a ceramic multilayer technology, such a multilayer coil component is suitable for applications in which electrical current is relatively small (such as for signal line noise removal, resonance circuits, and matching circuits). In contrast, such a multilayer coil component is not suitable for applications that require the supply of a relatively large electrical current (typically, for power inductors), such as in a power supply circuit for a large electrical current (typically, in a DC-DC converter).

As a power inductor, a metal composite coil component that allows the use of a large electrical current is increasingly used (see, for example, Japanese Unexamined Patent Application Publication No. 2015-88545). Such a metal-composite coil member has, for example, a structure in which a coil, such as an air-core coil, is embedded in a metal composite material (which contains magnetic metal powder dispersed in a resin (binder).

However, since such a metal composite coil component described above has a structure in which a wound air-core coil is embedded in a metal composite material, the air-core coil tends to get out of shape, as a result of which there are large variations in the characteristics of the coil.

SUMMARY OF THE INVENTION

Preferred embodiments of the present invention provide metal composite surface mount coil components in each of which a coil shape is maintained and excellent coil characteristics are achieved.

A surface mount coil component according to a preferred embodiment of the present invention includes an element body that includes a first surface, a second surface that opposes the first surface, and a third surface that connects the first surface and the second surface, the element body defining a compact that includes magnetic particles; a first conductor pattern that is provided at the first surface of the element body; a second conductor pattern that is provided at the second surface of the element body; input/output terminals that are provided at the third surface of the element body; and a plurality of metal pins that are embedded in the element body, one end of each metal pin being connected to the first conductor pattern, and the other end of each metal pin being connected to the second conductor pattern. The first conductor pattern, the second conductor pattern, and the plurality of metal pins define a coil conductor. The input/output terminals are defined by a pair of metal pins among the plurality of metal pins, the pair of metal pins being exposed at the third surface of the element body. The third surface is a mounting surface.

A method of manufacturing a surface mount coil component according to a preferred embodiment of the present invention is provided. The surface mount coil component includes an element body that includes a first surface, a second surface that opposes the first surface, and a third surface that connects the first surface and the second surface, the element body defining a compact that includes magnetic particles; a first conductor pattern that is provided at the first surface of the element body; a second conductor pattern that is provided at the second surface of the element body; input/output terminals that are provided at the third surface of the element body; and a plurality of metal pins that are embedded in the element body, one end of each metal pin being connected to the first conductor pattern, and the other end of each metal pin being connected to the second conductor pattern. The first conductor pattern, the second conductor pattern, and the plurality of metal pins define a coil conductor. The input/output terminals are defined by a pair of metal pins among the plurality of metal pins, the pair of metal pins being exposed at the third surface of the element body. The third surface is a mounting surface. The method of manufacturing the surface mount coil component includes a step of embedding the plurality of metal pins in the element body and exposing the one end of each metal pin at the first surface and the other end of each metal pin at the second surface; a step of forming the coil conductor by forming the first conductor pattern that connects the one end of each of the plurality of metal pins to each other at the first surface of the element body and the second conductor pattern that connects the other end of each of the plurality of metal pins to each other at the second surface of the element body; and a step of forming the input/output terminals by exposing a portion of the pair of metal pins among the plurality of metal pins at the third surface of the element body.

A DC-DC converter according to a preferred embodiment of the present invention includes a switching element, and a choke coil that is connected to the switching element. The choke coil includes an element body that includes a first surface, a second surface that opposes the first surface, and a third surface that connects the first surface and the second surface, the element body defining a compact that includes magnetic particles; a first conductor pattern that is provided at the first surface of the element body; a second conductor pattern that is provided at the second surface of the element body; input/output terminals that are provided at the third surface of the element body; and a plurality of metal pins that are embedded in the element body, one end of each metal pin being connected to the first conductor pattern, and the other end of each metal pin being connected to the second conductor pattern. The first conductor pattern, the second conductor pattern, and the plurality of metal pins define a coil conductor. The input/output terminals are defined by a pair of metal pins among the plurality of metal pins, the pair of metal pins being exposed at the third surface of the element body. The third surface is a mounting surface of the choke coil.

According to preferred embodiments of the present invention, it is possible to provide surface mount coil components in each of which the coil shape is maintained and that achieve excellent coil characteristics, methods of manufacturing the same, and DC-DC converters.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A surface mount coil component according to a preferred embodiment of the present invention includes an element body that includes a first surface, a second surface that opposes the first surface, and a third surface that connects the first surface and the second surface, the element body defining a compact that includes magnetic particles; a first conductor pattern that is provided at the first surface of the element body; a second conductor pattern that is provided at the second surface of the element body; input/output terminals that are provided at the third surface of the element body; and a plurality of metal pins that are embedded in the element body, one end of each metal pin being connected to the first conductor pattern, the other end of each metal pin being connected to the second conductor pattern. The first conductor pattern, the second conductor pattern, and the plurality of metal pins define a coil conductor. The input/output terminals are defined by a pair of metal pins among the plurality of metal pins, and the pair of metal pins are exposed at the third surface of the element body.

In a surface mount coil component according to a preferred embodiment of the present invention, preferably, the magnetic particles are magnetic metal powder, and the element body is a pressurized-powder compact that includes the magnetic metal powder, for example.

In a surface mount coil component according to a preferred embodiment of the present invention, preferably, a first magnetic layer and a second magnetic layer are provided at the first surface and the second surface of the element body, respectively, so as to cover the first conductor pattern and the second conductor pattern, respectively.

In a surface mount coil component according to a preferred embodiment of the present invention, preferably, the first magnetic layer and the second magnetic layer are each a composite magnetic body that includes magnetic particles that are dispersed in a resin, for example.

In a surface mount coil component according to a preferred embodiment of the present invention, preferably, a relative permeability of the element body is higher than a relative permeability of the first magnetic layer and a relative permeability of the second magnetic layer.

In a surface mount coil component according to a preferred embodiment of the present invention, preferably, the input/output terminals are shaved-out surfaces of the metal pins that are exposed at the third surface.

In a surface mount coil component according to a preferred embodiment of the present invention, preferably, of the plurality of metal pins, the pair of metal pins that define the input/output terminals are prismatic metal pins, and, of the plurality of metal pins, the metal pin or the metal pins other than the pair of metal pins that define the input/output terminals are circular cylindrical or substantially circular cylindrical metal pins.

In a surface mount coil component according to a preferred embodiment of the present invention, preferably, regarding a fourth surface that connects the first surface, the second surface, and the third surface of the element body, a length of a side of the fourth surface that contacts the first surface and the second surface may be less than a length of a side of the fourth surface that contacts the third surface.

Due to the above-described structure, the length of the first conductor pattern and the length of the second conductor pattern are able to be made less than the length of each metal pin. Therefore, the proportion of the lengths of the metal pins of the conductor coil with respect to the entire conductor coil is increased, so that it is possible to reduce the resistance of the coil conductor.

A method of manufacturing a surface mount coil component according to a preferred embodiment of the present invention is provided. The surface mount coil component includes an element body that includes a first surface, a second surface that opposes the first surface, and a third surface that connects the first surface and the second surface, the element body defining a compact that includes magnetic particles; a first conductor pattern that is provided at the first surface of the element body; a second conductor pattern that is provided at the second surface of the element body; input/output terminals that are provided at the third surface of the element body; and a plurality of metal pins that are embedded in the element body, one end of each metal pin being connected to the first conductor pattern, and the other end of each metal pin being connected to the second conductor pattern. The first conductor pattern, the second conductor pattern, and the plurality of metal pins define a coil conductor. The input/output terminals are defined by a pair of metal pins among the plurality of metal pins, and the pair of metal pins are exposed at the third surface of the element body. The method of manufacturing the surface mount coil component includes a step of embedding the plurality of metal pins in the element body and exposing the one end of each metal pin at the first surface and the other end of each metal pin at the second surface; a step of forming the coil conductor by forming the first conductor pattern that connects the one end of each of the plurality of metal pins to each other at the first surface of the element body and the second conductor pattern that connects the other end of each of the plurality of metal pins to each other at the second surface of the element body; and a step of forming the input/output terminals by exposing a portion of the pair of metal pins among the plurality of metal pins at the third surface of the element body.

A method of manufacturing a surface mount coil component according to a preferred embodiment of the present invention further includes a step of providing a first magnetic layer and a second magnetic layer on the first surface and the second surface of the element body, respectively, so as to cover the first conductor pattern and the second conductor pattern, respectively.

A DC-DC converter according to a preferred embodiment of the present invention includes a switching element, and a choke coil that is connected to the switching element. The choke coil includes an element body that includes a first surface, a second surface that opposes the first surface, and a third surface that connects the first surface and the second surface, the element body defining a compact that contains magnetic particles; a first conductor pattern that is provided at the first surface of the element body; a second conductor pattern that is provided at the second surface of the element body; input/output terminals that are provided at the third surface of the element body; and a plurality of metal pins that are embedded in the element body, one end of each metal pin being connected to the first conductor pattern, and the other end of each metal pin being connected to the second conductor pattern. The first conductor pattern, the second conductor pattern, and the plurality of metal pins define a coil conductor. The input/output terminals are defined by a pair of metal pins among the plurality of metal pins, and the pair of metal pins are exposed at the third surface of the element body.

A surface mount coil component according to a preferred embodiment of the present invention is described below with reference to the accompanying drawings. In the figures, members that are the same or substantially the same are denoted by the same reference numerals. In FIGS. 1 to 7, the internal structures of an element body 4 and a first magnetic layer 6a are shown by making the element body 4 and the first magnetic layer 6a transparent.

Figure 1:
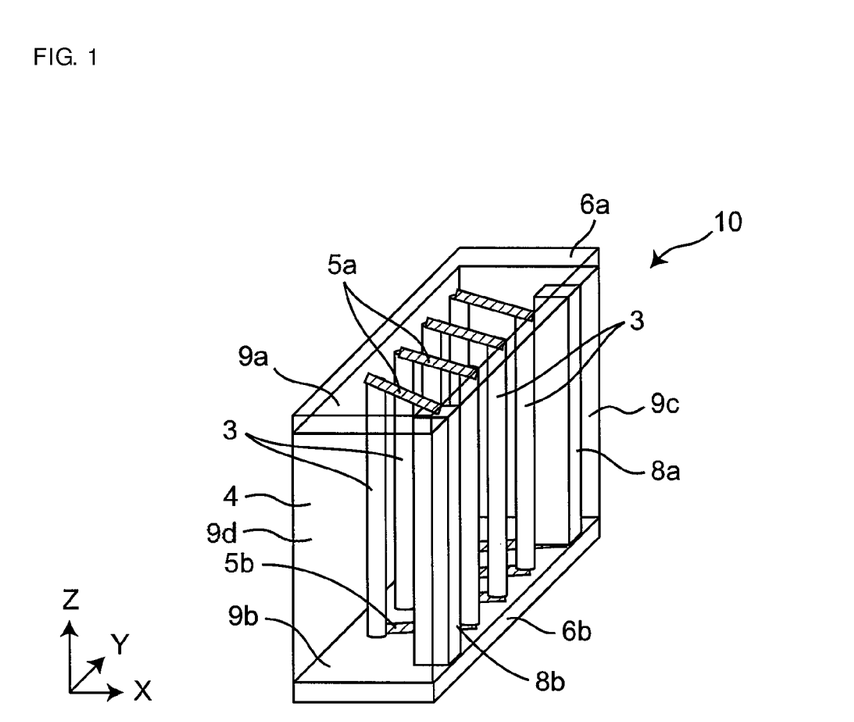
FIG. 1 is a schematic perspective view of a structure of a surface mount coil component according to a preferred embodiment of the present invention.

FIG. 1 is a schematic perspective view of a structure of a surface mount coil component 10 according to a preferred embodiment. The surface mount coil component 10 includes an element body 4 defining a compact that contains magnetic particles, a coil conductor that is provided in the element body 4, and input/output terminals 8a and 8b that are connected to the coil conductor. The element body 4 includes a first surface 9a, a second surface 9b that opposes the first surface 9a, and a third surface 9c that connects the first surface 9a and the second surface 9b. The input/output terminals 8a and 8b are provided at the third surface 9c of the element body 4. The coil conductor includes a plurality of metal pins 2a, 2b, and 3 that are embedded in the element body 4, a first conductor pattern 5a that is provided at the first surface 9a of the element body 4, and a second conductor pattern 5b that is provided at the second surface 9b of the element body 4. A winding axis of the coil conductor is a y axis. One end of each of the metal pins 2a, 2b, and 3 is exposed at the first surface 9a, and the other end of each of the metal pins 2a, 2b, and 3 is exposed at the second surface 9b. Each of the metal pins 2a, 2b, and 3 extends along a z axis direction. The first conductor pattern 5a connects the one end of each of the metal pins 2a, 2b and 3, which are exposed at the first surface 9a, to each other. The second conductor pattern 5b connects the other end of each of the metal pins 2a, 2b and 3, which are exposed at the second surface 9b, to each other. The input/output terminals 8a and 8b are defined by, among the plurality of metal pins 2a, 2b, and 3, a pair of metal pins 2a and 2b that are exposed at the third surface 9c of the element body 4. In the surface mount coil component 10, the third surface 9c of the element body 4 is a mounting surface.

In the surface mount coil component 10, as the element body 4, a compact that includes magnetic particles, for example, a compact made of a metal composite material or a compact made of magnetic particles not including a binder is preferably used. Accordingly, since the element body 4 has a high relative permeability $\mu$, the coil component is useful as a surface mount coil component defining a power inductor. As the main structural elements of the coil conductor, the metal pins 2a, 2b, and 3 that are embedded in the element body 4 defining a compact made of a metal composite material or a compact made of magnetic particles not including a binder are preferably used. Accordingly, a direct-current resistance Rdc of the coil conductor is reduced, so that a coil component defining a power inductor having a small loss (copper loss) is able to be obtained. Further, since as a portion of the coil conductor, the metal pins 2a, 2b, and 3 that are embedded in the element body 4 defining a compact made of a metal composite material or a compact made of magnetic particles not including a binder are preferably used, even when the element body 4 is compacted out of pressurized powder, the metal pins 2a, 2b, and 3 are not easily deformed, so that the shape of the coil conductor is able to be maintained. Further, since, as the input/output terminals 8a and 8b, exposed portions of the metal pins 2a and 2b at the third surface 9c of the element body 4 are used, it is possible to easily mount the coil component 10 onto, for example, the surface of a board with the third surface 9c defining and functioning as a mounting surface. It is not necessary to add a different step of forming the input/output terminals 8a and 8b (for example, after individually forming each coil component, changing the orientation and printing a land pattern), so that it is possible to manufacture the coil component with a simple process.

In the surface mount coil component 10, a first magnetic layer 6a and a second magnetic layer 6b, which are made of a metal composite material, may preferably be provided on the first surface 9a and the second surface 9b of the element 4, respectively. This makes it possible to reduce leakage of magnetic flux from the first surface 9a and the second surface 9b of the element body 4.

Figure 7:
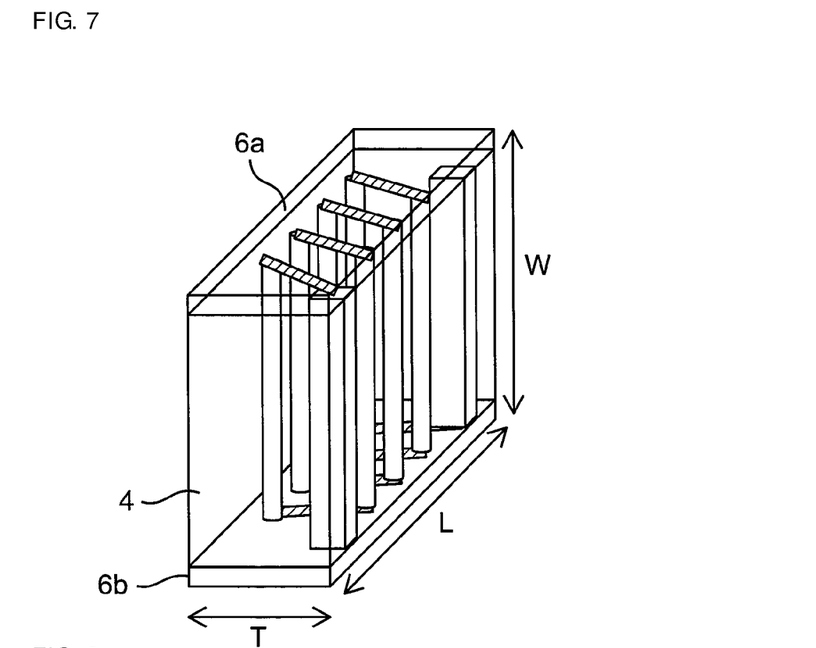
FIG. 7 is schematic perspective view of a step following the step in FIG. 6 of a method of manufacturing a surface mount coil component according to a preferred embodiment of the present invention.

Further, in the surface mount coil component 10, a thin surface mount device may be provided. More specifically, a T dimension (dimension in an x direction) in FIG. 7 is less than an L dimension (dimension in a y direction) in FIG. 7 and a W dimension (dimension in a z direction) in FIG. 7, so that it is possible to easily reduce the height. On the other hand, by disposing the metal pins 2a, 2b, and 3 along a longer side of the element body 4, such as in the z direction, it is possible to increase the proportion by which the metal pins 2a, 2b, and 3 occupy the coil conductor, and to reduce the resistance of the coil conductor.

The structural elements of the surface mount coil component 10 are described below.

The element body 4 is a compact that includes magnetic particles. For example, the element body 4 may preferably be a compact made from a composite magnetic body in which magnetic particles are dispersed in a binder, in particular, a compact made of a metal composite material in which magnetic metal powder is dispersed in a binder (resin), or a compact not including a binder and made of magnetic particles that contact each other via oxide films on their surfaces. In this case, the oxide films between the magnetic particles may be connected to each other. Further, the crystals of the oxide films may be continuously connected to each other. As the magnetic metal powder, for example, Fe-based magnetic metal powder is preferably used. The Fe-based magnetic metal powder may include impurities or additives, such as Mn or Cr, for example. The binder is preferably, for example, epoxy resin. The magnetic particles are not limited to Fe-based magnetic metal powder. The magnetic particles may be ferrite powder, for example. When Fe-based magnetic metal powder is used as the magnetic particles, the relative permeability is high and saturation does not easily occur. Therefore, Fe-based magnetic metal powder is preferable for a surface mount coil component defining a power inductor.

The element body 4 may preferably be made of a composite magnetic body, in particular, by compacting pressurized powder after providing a metal composite material by, for example, a printing step. It is preferable that the volume fraction of the magnetic metal powder is, for example, greater than or equal to about 80 vol %, and it is more preferable that the volume fraction of the magnetic metal powder be greater than or equal to about 95 vol %. Since it is possible to increase the proportion of the magnetic metal powder, it is useful for a power inductor. Since the element body 4 is not only simply provided by a printing step, but is also formed by compacting pressurized powder, the filling density of the magnetic metal powder is able to be increased. Therefore, the relative permeability is high.

It is possible to form the element body 4 by compacting magnetic particles such that the magnetic particles contact each other via oxide films on their surfaces without using a binder (resin).

That is, the relative permeability of the element body 4 is higher than the relative permeabilities of the first magnetic layer 6a and the second magnetic layer 6b, which are provided by only a printing step described below.

The element body 4 includes the first surface 9a and the second surface 9b that oppose each other. The element body 4 also includes the third surface 9c that connects the first surface 9a and the second surface 9b. The third surface 9c is a surface that defines and functions as a mounting surface during surface mounting. When considering a fourth surface 9d that connects the first surface 9a, the second surface 9b, and the third surface 9c of the element body 4, the T dimension (dimension in the x direction) is the length of a side of the fourth surface 9d that contacts the first surface 9a and the second surface 9b. The W dimension (dimension in the z direction) is the length of a side of the fourth surface 9d that contacts the third surface 9c. When the T dimension (dimension in the x direction) in FIG. 7 is less than the L dimension (dimension in the y direction) in FIG. 7 and the W dimension (dimension in the z direction) in FIG. 7, it is possible to easily reduce the height of the coil component 10.

The element body 4 may preferably be, for example, a rectangular or substantially rectangular parallelepiped body.

The coil conductor is provided in the element body 4. More specifically, the coil conductor includes the plurality of metal pins 2a, 2b, and 3 that are embedded in the element body 4, the first conductor pattern 5a that is provided at the first surface 9a of the element body 4, and the second conductor pattern 5b that is provided at the second surface 9b of the element body 4. The winding axis of the coil conductor is the y axis.

The metal pins 2a, 2b, and 3 are embedded in the element body 4. One end of each of the metal pins 2a, 2b, and 3 is exposed at the first surface 9a of the element body 4, and the other end of each of the metal pins 2a, 2b, and 3 is exposed at the second surface 9b of the element body 4. Each of the metal pins 2a, 2b, and 3 extends along the z axis direction. Here, the term "exposed" means that the one end or the other end of each of the metal pins 2a, 2b, and 3 is flush with the first surface 9a or the second surface 9b of the element body 4, or that the metal pins 2a, 2b, and 3 protrude therefrom.

For the metal pins 2a, 2b, and 3, metal pins whose main component is Cu, for example, may preferably be used. Alternatively, for the metal pins 2a, 2b, and 3, for example, metal pins in which a Cu-based metal block, for example, is drawn into a predetermined shape may be used. The materials of the metal pins 2a, 2b, and 3 only need to be conductive, and is thus not limited to Cu. Accordingly, other conductive materials, such as Ag or Al, may be used. The outside diameters of the metal pins 2a, 2b, and 3 may preferably be, for example, greater than or equal to about 0.1 mm and less than or equal to about 0.5 mm. The lengths of the metal pins 2a, 2b, and 3 may be, for example, greater than or equal to about 0.5 mm and less than or equal to about 10 mm.

Of the metal pins 2a, 2b, and 3, the pair of metal pins 2a and 2b that define the corresponding input/output terminals 8a and 8b may preferably be prismatic metal pins, for example. By structuring their cross sections into prismatic shapes, when the metal pins 2a and 2b are cut or shaved out as described below, even if the cutting position or the shaving-out position is displaced, it is possible to reduce or prevent changes in the areas of the cross sections. On the other hand, of the plurality of metal pins 2a, 2b, and 3, the metal pins 3 other than the pair of metal pins 2a and 2b, which define the corresponding input/output terminals, may be circular cylindrical or substantially circular cylindrical metal pins, for example. By structuring their cross sections into circular cylindrical or substantially circular cylindrical shapes, even if a skin effect occurs when an electrical current having a high frequency flows, it is possible to reduce or prevent uneven distribution of the electrical current to the corner portions.

The input/output terminals 8a and 8b may be formed by cutting the metal pins 2a and 2b. Alternatively, they may be formed by a shaving-out operation such that the metal pins 2a and 2b are exposed from the third surface 9c of the element body 4. "Shaved-out surfaces" of the input/output terminals 8a and 8b may be the surfaces of the input/output terminals 8a and 8b that are acquired by cutting one of metal pin 2a and metal pin 2b. Alternatively, the input/output terminals 8a and 8b may be formed by exposing the metal pins 2a and 2b at the third surface 9c of the element body 4 by shaving out a surface of the element body 4 in which the metal pins 2a and 2b are embedded.

Further, the metal pins 2a, 2b, and 3 may preferably include their surfaces plated with, for example, Ni/Au. Alternatively, the side surface of each metal pin 3 other than the one end and the other end of the metal pin 3 may be covered with an insulating film.

By using the metal pins 2a, 2b, and 3 as a portion of the coil conductor as described above, the resistance of coil conductor is smaller than that of the conductor patterns that are formed by, for example, a printing step.

Hitherto, as a conductor having a certain length, a multilayer conductor had a problem in that as the number of laminations increases, positional displacement occurs. On the other hand, when a columnar conductor is provided by forming a via by irradiating one layer having a film thickness with laser, and by filling the inside of the via with a conducting material, problems, such as a taper being formed or the diameter tending to increase, occur.

In contrast, when the metal pins 2a, 2b, and 3 that are embedded in the element body 4 define a portion of the coil conductor, it is possible to reduce or prevent positional displacement and to obtain a constant diameter, so that the aforementioned problems are able to be overcome.

The lengths of the metal pins 2a, 2b, and 3 (FIG. 7: W dimension (dimension in the z direction)) are preferably greater than the T dimensions (FIG. 7: dimension in the x direction). Therefore, the proportion of the lengths of the metal pins 2a, 2b, and 3 of the conductor coil with respect to the entire coil conductor is increased, so that it is possible to further reduce the resistance of the coil conductor and to reduce copper loss.

The first conductor pattern 5a is provided at the first surface 9a of the element body 4 and connects the one end of each of the metal pins 2a, 2b, and 3 to each other. The second conductor pattern 5b is provided at the second surface 9b of the element body 4 and connects the other end of each of the metal pins 2a, 2b, and 3 to each other.

The first conductor pattern 5a and the second conductor pattern 5b may preferably be made, for example, of a conductive paste in which metal powder, such as Ag, Al, Cu, or Au powder, is dispersed in a binder. The first conductor pattern 5a and the second conductor pattern 5b may preferably be provided by, for example, a printing step, but is not limited thereto. They may be provided by other steps.

The first magnetic layer 6a may preferably be provided on the first surface 9a of the element body 4 so as to cover the first conductor pattern 5a. The second magnetic layer 6b may preferably be provided on the second surface 9b of the element body 4 so as to cover the second conductor pattern 5b. This makes it possible to reduce or prevent leakage of magnetic flux from the first surface 9a and the second surface 9b of the element body 4.

The first magnetic layer 6a and the second magnetic layer 6b may preferably be a compact defined by a composite magnetic body including magnetic particles that are dispersed in a binder, in particular, a compact defined by a metal composite material in which magnetic metal powder is dispersed in a binder (resin), or a compact not including a binder and including magnetic particles that contact each other via oxide films on their surfaces. As the magnetic metal powder, for example, Fe-based magnetic metal powder is preferably used. The binder is preferably, for example, epoxy resin. The magnetic particles are not limited to Fe-based magnetic metal powder. The magnetic particles may be ferrite powder.

The first magnetic layer 6a and the second magnetic layer 6b may be provided by, for example, a printing step, but is not limited thereto. The first magnetic layer 6a and the second magnetic layer 6b may be provided by other steps.

FIGS. 2 to 7 are each a schematic perspective view of a step of a method of manufacturing the surface mount coil component. Each step of the method of manufacturing the surface mount coil component is described below.

Figure 2:
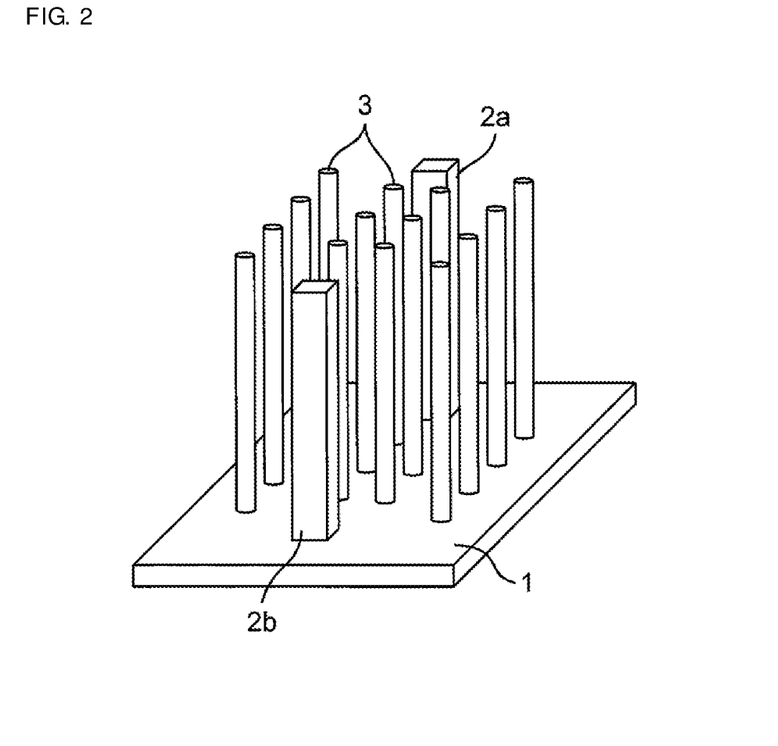
FIG. 2 is a schematic perspective view of a step of a method of manufacturing a surface mount coil component according to a preferred embodiment of the present invention.

The metal pins 2a, 2b, and 3 stand on a support base 1 (FIG. 2). Any support base 1 may be used as long as the support base 1 enables the metal pins 2a, 2b, and 3 to stand. Of the metal pins 2a, 2b, and 3, the metal pins 3 of the coil are metal pins that are circular or substantially circular in cross section. When metal pins that are circular or substantially circular in cross section are used, even if an electrical current having a high frequency flows, uneven distribution of the electrical current towards the corner portions caused by the skin effect does not easily occur. On the other hand, the metal pins 2a and 2b defining the corresponding input/output terminals 8a and 8b are metal pins that are rectangular or substantially rectangular in cross section. In a subsequent cutting step, the cross-sectional shapes of the metal pins after the cutting thereof are the same or substantially the same even if a cutting line is slightly displaced when the metal pins 2a and 2b are being cut. That is, even if the cutting position is slightly displaced, it is possible to reduce or prevent changes in the areas of the cross sections. For the metal pins 2a, 2b, and 3, for example, metal pins in which a Cu-based metal block is drawn into a predetermined shape may preferably be used.

Figure 3:
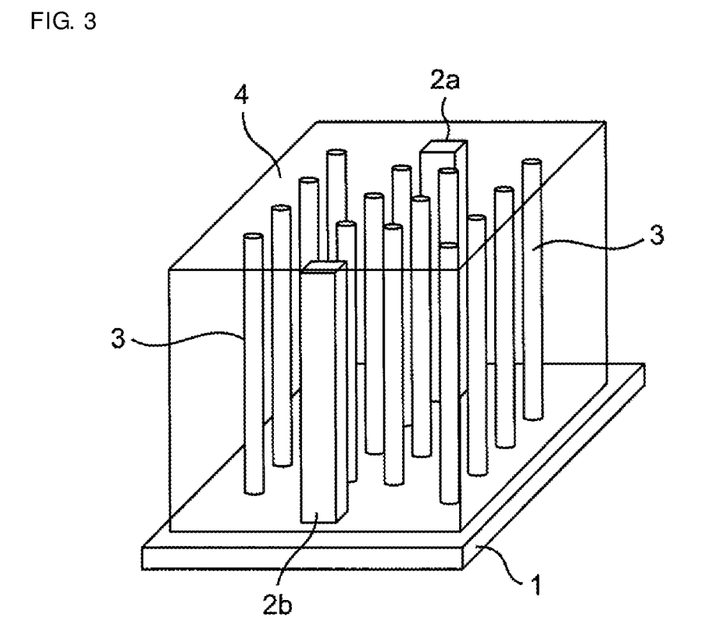
FIG. 3 is a schematic perspective view of a step following the step in FIG. 2 of a method of manufacturing a surface mount coil component according to a preferred embodiment of the present invention.

Next, a metal composite material is applied to each of the metal pins 2a, 2b, and 3, and each of the metal pins 2a, 2b, and 3 is embedded in the metal composite (FIG. 3). The metal composite material is preferably, for example, a material including a binder, such as epoxy resin, mixed with an Fe-based magnetic metal powder. More specifically, the metal pins 2a, 2b, and 3 are embedded in the metal composite material by applying an unsolidified metal composite material to the metal pins 2a, 2b, and 3 by, for example, a printing step; and then, by applying pressure to the metal composite material from an up-down direction and compacting the metal composite material (compacting pressurized powder). This makes it possible to obtain the element body 4 in which each of the metal pins 2a, 2b, and 3 is embedded in the metal composite material.

In compacting the pressurized powder into the element body 4 made of the metal composite material in which the metal pins 2a, 2b, and 3 are embedded, the metal pins 2a, 2b, and 3 are not easily deformed when the pressurized powder is being compacted. On the other hand, when compacting pressurized powder for existing winding coils, the winding coils tend to be deformed. Therefore, the compacting of pressurized powder into the element body 4 made of the metal composite material in which the metal pins 2a, 2b, and 3 are embedded is much easier to perform and enables the shape of the coil conductor to be more easily maintained than in the compacting of pressurized powder into existing winding coils.

Figure 4:
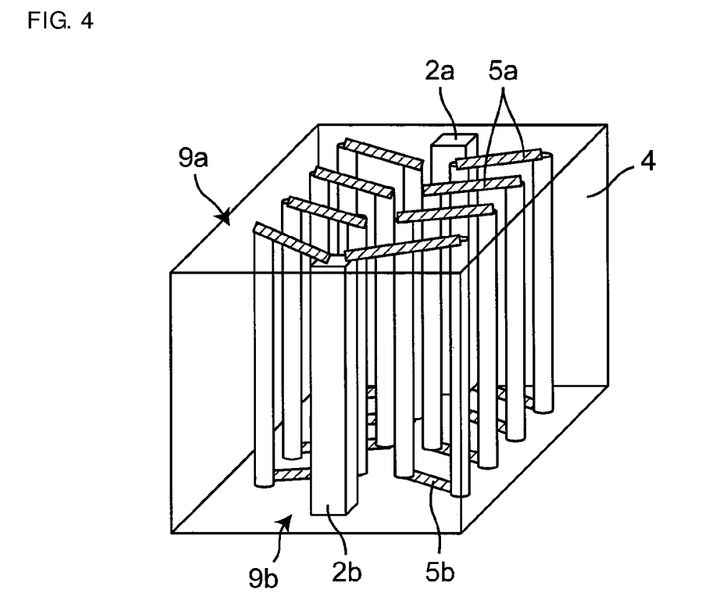
FIG. 4 is a schematic perspective view of a step following the step in FIG. 3 of a method of manufacturing a surface mount coil component according to a preferred embodiment of the present invention.

Next, the upper surface (first surface) 9a and the lower surface 9b (second surface) of the element body 4 made of the metal composite material are subjected to grinding, and the metal pins 2a, 2b, and 3 are exposed, after which the first conductor pattern 5a is formed at the upper surface (first surface) 9a and the second conductor pattern 5b is formed at the lower surface (second surface) 9b (FIG. 4). Each of the conductor patterns 5a and 5b is formed by patterning using a conductive paste and plating. The first conductor pattern 5a and the second conductor pattern 5b may be formed by only plating, or by using other thin-film processes. Here, the term "exposed" means that the metal pins 2a, 2b, and 3 are exposed at the upper surface 9a and the lower surface 9b of the element body 4. The term "exposed" means that the one end or the other end of each of the metal pins 2a, 2b, and 3 is flush with the first surface 9a or the second surface 9b of the element body 4, or that the metal pins 2a, 2b, and 3 protrude therefrom.

Figure 5:
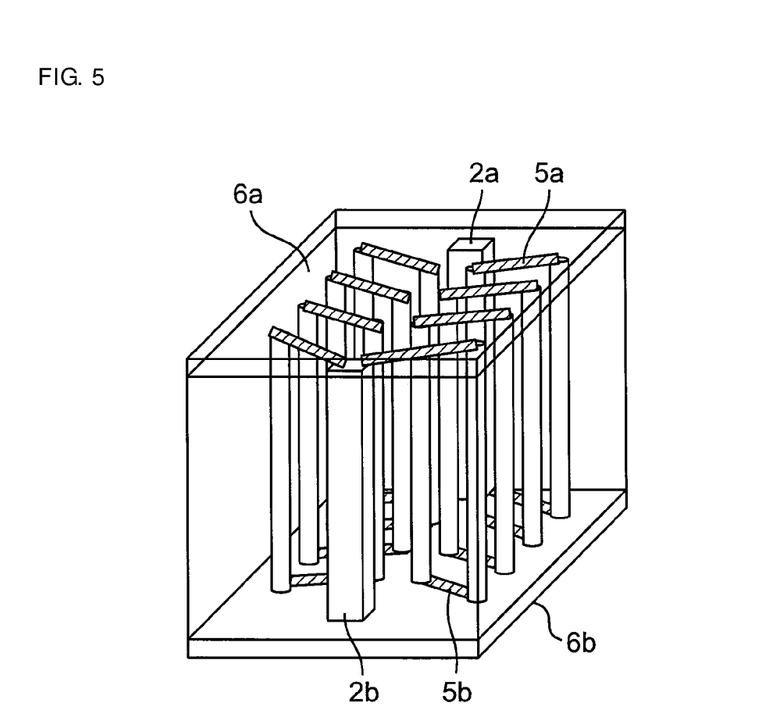
FIG. 5 is a schematic perspective view of a step following the step in FIG. 4 of a method of manufacturing a surface mount coil component according to a preferred embodiment of the present invention.

The first surface 9a and the second surface 9b of the element body 4 are each coated with a metal composite material to form the first magnetic layer 6a and the second magnetic layer 6b (FIG. 5). The first magnetic layer 6a and the second magnetic layer 6b are not essential. For example, the first magnetic layer 6a and the second magnetic layer 6b need not be provided.

The element body 4 is a pressurized-powder compact. The first magnetic layer 6a on the first surface 9a and the second magnetic layer 6b on the second surface 9b are each a print compact. Since their states differ, the filling densities of magnetic metal powder (that is, the relative permeabilities of the layers) differ. More specifically, the volume fraction of the magnetic metal powder for the element body 4 is high and is preferably greater than or equal to about 80 vol %, for example, and more preferably greater than or equal to about 95 vol %, for example. On the other hand, since the first magnetic layer 6a and the second magnetic layer 6b are formed by printing, the volume fraction of the magnetic metal powder is preferably greater than or equal to about 40 vol % and less than or equal to about 80 vol %, for example. When the relative permeability of the element body 4 and those of the first magnetic layer 6a and the second magnetic layer 6b are compared, the relative permeability of the element body 4 is higher. Although the conductivities of the conductive patterns 5a and 5b are lower than those of the metal pins 2a and 2b, when such portions, that is, the first magnetic layer 6a and the second magnetic layer 6b are formed of magnetic materials having a low relative permeability, effective permeability is reduced, so that it is possible to reduce or prevent deterioration in the Q characteristics as a coil.

Figure 6:
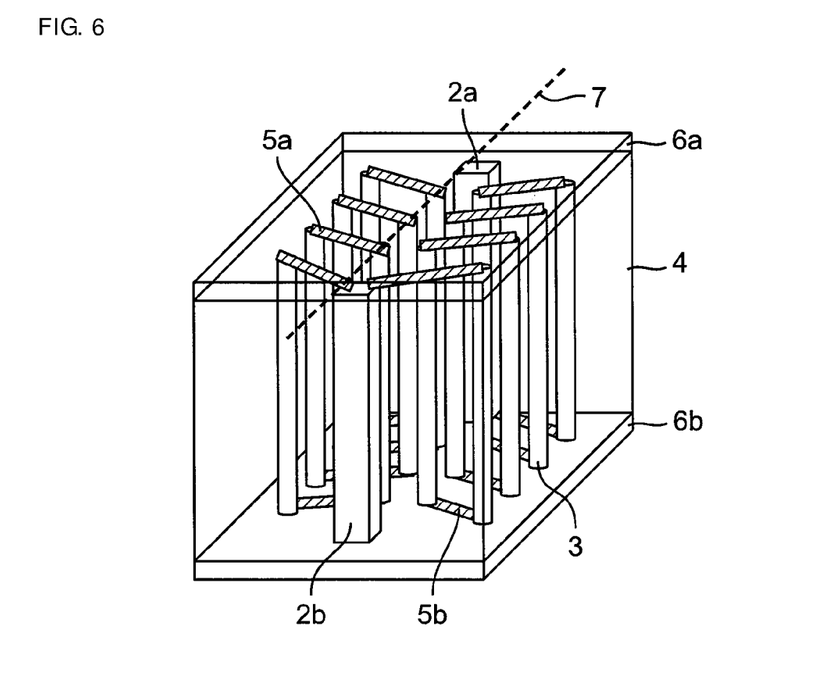
FIG. 6 is a schematic perspective view of a step following the step in FIG. 5 of a method of manufacturing a surface mount coil component according to a preferred embodiment of the present invention.

The element body 4 is cut along a break line (FIG. 6). An end surface of the first-end-portion metal pin 2a and an end surface of the second-end-portion metal pin 2b exposed by the cutting thereof become the input/output terminal 8a and the input/output terminal 8b, respectively. A surface of the input/output terminal 8a and a surface of the input/output terminal 8b may be further plated with, for example, an Ni/Au or an Ni/Sn film.

The first-end-portion metal pin 2a and the second-end-portion metal pin 2b need not be cut. For example, instead of cutting the element body 4 and cutting the first-end-portion metal pin 2a and the second-end-portion metal pin 2b, it is possible to shave the third surface 9c of the element body 4 and shave out the metal pins 2a and 2b that become the input/output terminals. In this case, the input/output terminals 8a and 8b are individually formed by the shaving-out operation.

By performing the steps above, the surface mount coil component 10 is obtained.

The element body 4 may be a compact made of magnetic particles not including a binder, instead of a compact made of a metal composite material.

Figure 8:
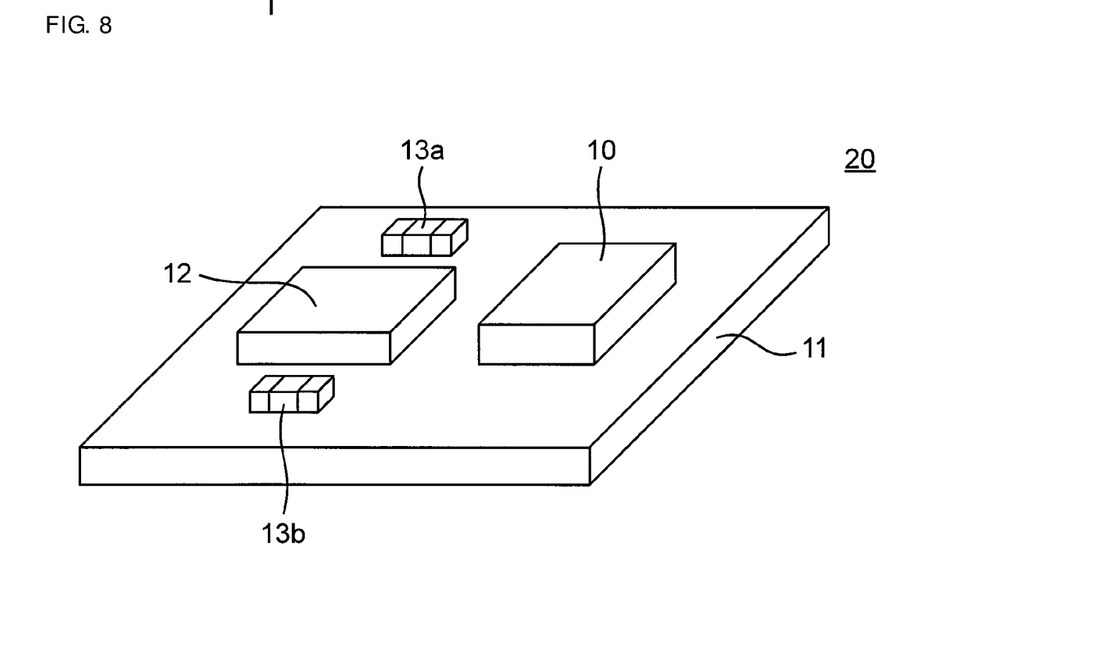
FIG. 8 is schematic perspective view of a structure of a DC-DC converter including a surface mount coil component according to a preferred embodiment of the present invention.
Figure 9:
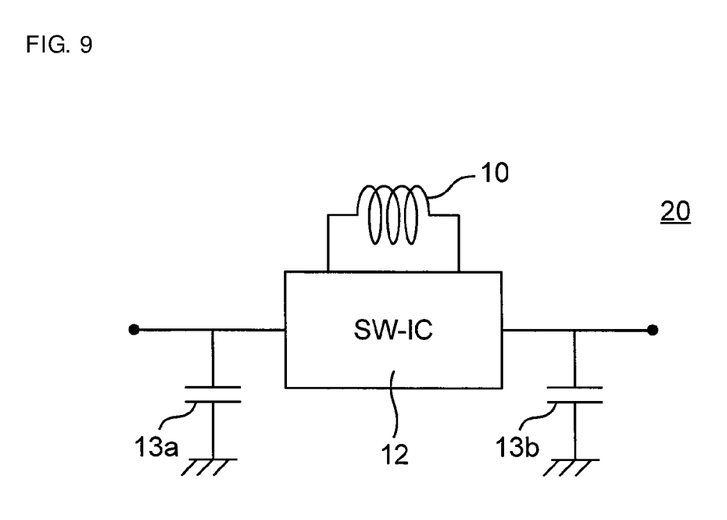
FIG. 9 shows an equivalent circuit of the DC-DC converter in FIG. 8.

FIG. 8 is schematic perspective view of a structure of an exemplary DC-DC converter including a surface mount coil component 10 according to a preferred embodiment of the present invention. FIG. 9 shows an equivalent circuit of the DC-DC converter 20 in FIG. 8.

As shown in FIG. 9, the DC-DC converter (step-up/step-down) 20 includes a switching element 12 and a choke coil defined by the surface mount coil component 10 according to the above-described preferred embodiment that is connected to the switching element 12. The DC-DC converter 20 further includes an input capacitor 13a and an output capacitor 13b. One end of the input capacitor 13a is connected to an input terminal of the switching element 12. The other end of the input capacitor 13a is connected to ground. One end of the output capacitor 13b is connected to an output terminal of the switching element 12. The other end of the output capacitor 13b is connected to ground.

According to this structure, since the surface mount coil component 10 according to the above-described preferred embodiment is used as a choke coil, it is possible to improve the performance, such as DC superimposition characteristics, of the DC-DC converter, and to provide a DC-DC converter that enables the use of a large electrical current.

The DC-DC converter (step-up/step-down) 20 has a structure in which the switching element 12, the input capacitor 13a, the output capacitor 13b, and the power inductor (choke coil) 10 are mounted on a surface of a printed circuit board 11.

In the present disclosure, various practical configurations described above and/or any of the practical configurations among the examples and/or the examples may be combined as appropriate, and the effects provided by each of the practical configurations and/or the examples are able to be provided.

The surface mount coil components according to preferred embodiments of the present invention are useful as surface mount coil components whose coil shapes are maintained and achieve excellent coil characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface mount coil component comprising:
   an element body that includes a first surface, a second surface that opposes the first surface, and a third surface that connects the first surface and the second surface, the element body defining a compact that includes magnetic particles;
   a first conductor pattern that is provided at the first surface of the element body;
   a second conductor pattern that is provided at the second surface of the element body;
   input/output terminals that are provided at the third surface of the element body; and
   a plurality of metal pins that are embedded in the element body, one end of each metal pin being connected to the first conductor pattern, and another end of each metal pin being connected to the second conductor pattern; wherein
   the first conductor pattern, the second conductor pattern, and the plurality of metal pins define a coil conductor; and
   the input/output terminals are defined by a pair of metal pins among the plurality of metal pins, the pair of metal pins being exposed at the third surface of the element body, the third surface being a mounting surface.

2. The surface mount coil component according to claim 1, wherein the magnetic particles include magnetic metal powder, and the element body is a pressurized-powder compact that includes the magnetic metal powder.

3. The surface mount coil component according to claim 1, wherein a first magnetic layer and a second magnetic layer are provided on the first surface and the second surface of the element body, respectively, so as to cover the first conductor pattern and the second conductor pattern, respectively.

4. The surface mount coil component according to claim 3, wherein the first magnetic layer and the second magnetic layer are each a composite magnetic body that includes magnetic particles that are dispersed in a resin.

5. The surface mount coil component according to claim 3, wherein a relative permeability of the element body is higher than a relative permeability of the first magnetic layer and a relative permeability of the second magnetic layer.

6. The surface mount coil component according to claim 1, wherein the input/output terminals are shaved-out surfaces of the pair of metal pins that are exposed at the third surface.

7. The surface mount coil component according to claim 1, wherein
of the plurality of metal pins, the pair of metal pins that define the input/output terminals are prismatic metal pins; and
of the plurality of metal pins, the metal pin or the metal pins other than the pair of metal pins that define the input/output terminals are circular cylindrical or substantially circular cylindrical metal pins.

8. The surface mount coil component according to claim 1, wherein
the element body further includes a fourth surface that connects the first surface, the second surface, and the third surface of the element body; and
a length of a side of the fourth surface that contacts the first surface and the second surface is less than a length of a side of the fourth surface that contacts the third surface.

9. A DC-DC converter comprising:
a switching element; and
a choke coil that is connected to the switching element; wherein
the choke coil includes:
an element body that includes a first surface, a second surface that opposes the first surface, and a third surface that connects the first surface and the second surface, the element body defining a compact that includes magnetic particles;
a first conductor pattern that is provided at the first surface of the element body;
a second conductor pattern that is provided at the second surface of the element body;
input/output terminals that are provided at the third surface of the element body; and
a plurality of metal pins that are embedded in the element body, one end of each metal pin being connected to the first conductor pattern, and another end of each metal pin being connected to the second conductor pattern; wherein
the first conductor pattern, the second conductor pattern, and the plurality of metal pins define a coil conductor; and
the input/output terminals are defined by a pair of metal pins among the plurality of metal pins, the pair of metal pins being exposed at the third surface of the element body, the third surface being a mounting surface of the choke coil.

10. The DC-DC converter according to claim 9, wherein the magnetic particles are magnetic metal powder, and the element body is a pressurized-powder compact that includes the magnetic metal powder.

11. The DC-DC converter according to claim 9, wherein a first magnetic layer and a second magnetic layer are provided on the first surface and the second surface of the element body, respectively, so as to cover the first conductor pattern and the second conductor pattern, respectively.

12. The DC-DC converter according to claim 11, wherein the first magnetic layer and the second magnetic layer are each a composite magnetic body that includes magnetic particles that are dispersed in a resin.

13. The DC-DC converter according to claim 11, wherein a relative permeability of the element body is higher than a relative permeability of the first magnetic layer and a relative permeability of the second magnetic layer.

14. The DC-DC converter according to claim 9, wherein the input/output terminals are shaved-out surfaces of the pair of metal pins that are exposed at the third surface.

15. The DC-DC converter according to claim 9, wherein
of the plurality of metal pins, the pair of metal pins that define the input/output terminals are prismatic metal pins; and
of the plurality of metal pins, the metal pin or the metal pins other than the pair of metal pins that define the input/output terminals are circular cylindrical or substantially circular cylindrical metal pins.

16. The DC-DC converter according to claim 9, wherein
the element body further includes a fourth surface that connects the first surface, the second surface, and the third surface of the element body; and
a length of a side of the fourth surface that contacts the first surface and the second surface is less than a length of a side of the fourth surface that contacts the third surface.

* * * * *